United States Patent [19]

Watanabe et al.

[11] Patent Number: 5,403,916
[45] Date of Patent: Apr. 4, 1995

[54] METHOD FOR PRODUCING A LIGHT EMITTING DIODE HAVING TRANSPARENT SUBSTRATE

[75] Inventors: Masanori Watanabe; Haruhisa Takiguchi, both of Nara, Japan

[73] Assignee: Sharp Kabushiki Kaisha, Osaka, Japan

[21] Appl. No.: 196,013

[22] Filed: Feb. 10, 1994

[30] Foreign Application Priority Data

Feb. 10, 1993 [JP] Japan .................................. 5-022946
Dec. 20, 1993 [JP] Japan .................................. 5-320334

[51] Int. Cl.$^6$ .......................................... H01L 21/203
[52] U.S. Cl. .......................................... 437/127; 437/5; 437/23; 437/62; 437/129; 257/72
[58] Field of Search ............... 437/23, 127, 129, 3, 437/5, 62; 257/72

[56] References Cited

U.S. PATENT DOCUMENTS 5,189,500  2/1993  Kusumoki .............................. 252/72

FOREIGN PATENT DOCUMENTS 0420691  4/1991  European Pat. Off. .
0434233  6/1991  European Pat. Off. .
3-274770  12/1991  Japan .

OTHER PUBLICATIONS

Wada et al., "Electrical characteristics of low temperature directly bonded GaAs/InP heterojunctions" *Gallium Arsenide and Related Compounds 1992*, Proceedings of the Ninteenth International Symposium on Gallium Arsenide and Related Compounds, Karuizawa, Japan, Sep. 28, 1992–Oct. 2, 1992, Ikegami et al., eds., Institute of Physics Conference Series No. 129, Institute of Physics Publishing, pp. 947–948.
Lo et al., "Bonding by atomic rearrangement of InP/InGaAsP 1.5 $\mu$m wavelength leasers on GaAs substrates" *Appl. Phys. Lett.* (1991) 58(18):1961–1963.
Dudley et al., "144° C. operation of 1.3 $\mu$m InGaAsP vertical cavity lasers on GaAs substrates" *Appl. Phys. Lett.* (1992) 61(26):3095–3097.

Primary Examiner—R. Bruce Breneman
Assistant Examiner—Ramamohan Rao Paladugu
Attorney, Agent, or Firm—Morrison & Foerster

[57] ABSTRACT

A method for producing a light emitting diode includes the steps of: forming a first semiconductor multilayer on a first semiconductor substrate having a first conductivity type; forming a light emitting layer on the first semiconductor multilayer; forming a second semiconductor multilayer; disposing a second substrate which is transparent to light emitted from the light emitting layer on the second semiconductor multilayer; and bonding the second substrate and the second semiconductor multilayer through direct bonding with heating a vicinity of an interface between the second substrate and the second semiconductor multilayer.

17 Claims, 6 Drawing Sheets

(Prior Art)

METHOD FOR PRODUCING A LIGHT EMITTING DIODE HAVING TRANSPARENT SUBSTRATE

BACKGROUND OF THE INVENTION

1. Field of the Invention:

The present invention relates to a method for producing a light emitting diode (hereinafter referred to as an 'LED'), and more particularly to a method for producing an LED to be used for display and transmission purposes.

2. Description of the Related Art:

There has been a demand for a bright LED to be used for many applications including a display apparatus. One approach to make a bright LED is to improve the external emission efficiency of the light emitted inside an LED.

An LED is made of semiconductor materials having high refractive indices, e.g. approximately to the order of 3.5, which means total reflection can easily occur. Therefore, in the case where light is emitted from one plane face of the LED, only light which enters into the plane face at an angle less than the critical angle can propagate to the outside. Therefore, because of the total reflection, the external emission efficiency of the LED is usually not so high.

A common method for improving the external emission efficiency of an LED is to use a material capable of transmitting the generated light for a semiconductor substrate and to form a reflector on the back-side of the semiconductor substrate. In such an LED having a substrate transparent to the generated light, light reflected from the lower face of the semiconductor substrate can be emitted from the upper face, side faces, etc., whereas only the light emitted from the upper face can be utilized in cases where the semiconductor substrate is made of a material which does not transmit the generated light. LEDs having a substrate that is transparent to the generated light are realized as infrared LEDs in which a semiconductor material of an InGaAsP-type is used, infrared and red LEDs in which a semiconductor material of an AlGaAs-type is used, yellow LEDs in which a semiconductor material of a GaAsP-type is used, and green LEDs in which a semiconductor material of a GaP-type is used.

On the other hand, there have been developed red, yellow, and green LEDs in which a semiconductor material of an AlGaInP-type is used, and green and blue LEDs in which a semiconductor material of a ZnCdSSe-type is used. However, the above-mentioned technique of forming the substrate with a material transparent generated light is not applicable to these LEDs, because the lattice-matching conditions are not satisfactory in such applications. Moreover, the internal emission efficiency of the above-mentioned LEDs, in the case where a substrate that is opaque to generated light is used, tends to decrease because the substrates opaque to generated light are not suitable for these LEDs.

The internal emission efficiency of these LEDs can be improved by constituting their semiconductor substrates with a material opaque to generated light and growing the above-mentioned semiconductor materials on the substrates. However again, the external emission efficiency of such LEDs are inevitably lowered since the substrates that are opaque to generated light are used, as is described above.

Figure 13:
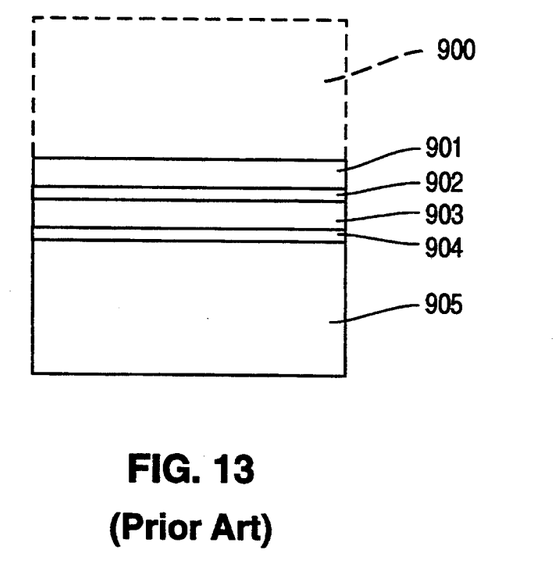
FIG. 13 is a cross-sectional view showing a conventional LED.

Japanese Laid-Open Patent Publication No. 3-274770 discloses an LED having the configuration shown in FIG. 13, in which the above-mentioned problems are solved. The LED is fabricated in the following manner: First, are an n-AlInP first cladding layer 901, an undoped AlGaInP light emitting layer 902, a p-AlInP second cladding layer 903, a p-AlGaInP intermediate band gap layer 904, and a p-AlGaAs retaining layer 905 are grown on a first n-GaAs substrate 900 in this order, by the use of an MOCVD (Metal Organic Vapor Phase Epitaxy) method. Next, the first n-GaAs substrate 900 is removed, and electrodes are formed. Thereafter, the LED structure is mounted on a stem, the p-AlGaAs retaining layer 905 being disposed at the bottom.

However, the above-mentioned fabrication method has the following problems: Firstly, an LED provided by this method requires the p-AlGaAs retaining layer to be formed very thick so that the overall LED can maintain physical strength after the removal of the first n-GaAs substrate 900. This requires too much time for the formation of the p-AlGaAs retaining layer 905 in cases where the above-mentioned MOCVD method is used. Secondly, in the case of an LED in which an $Al_xGa_{1-x}As$ ($0 \leq X \leq 1$) retaining layer is used, it is necessary to set the content rate X at a value near 1 in order to ensure that the retaining layer is transparent even in cases where the generated light is of a short wavelength such as that in the green band. However, this leads to the problem in that the retaining layer is susceptible to oxidation in air, thus becoming chemically unstable.

SUMMARY OF THE INVENTION

According to the present invention, a method for producing a light emitting diode includes the steps of: forming a first semiconductor multilayer on a first semiconductor substrate having a first conductivity type, the first semiconductor multilayer including at least one first semiconductor layer having the first conductivity type; forming a light emitting layer on the first semiconductor multilayer; forming a second semiconductor multilayer including at least one second semiconductor layer having a second conductivity type; disposing a second substrate which is transparent to light emitted from the light emitting layer on the second semiconductor multilayer; and bonding the second substrate and the second semiconductor multilayer through direct bonding with heating a vicinity of an interface between the second substrate and the second semiconductor multilayer.

In one embodiment of the invention, the second substrate is made of a semiconductor material having the second conductivity type.

In another embodiment of the invention, the second substrate is made of at least one selected from the group consisting of GaP, ZnSe, ZnS, and SiC.

In still another embodiment of the invention, the second substrate is made of a dielectric material.

In still another embodiment of the invention, the second substrate is made of at least one selected from the group consisting of $Al_2O_3$, glass, $TiO_2$, MgO, and a compound thereof.

In still another embodiment of the invention, the bonding step is conducted by applying a pressure from the side of at least one of the first substrate and the second substrate.

In still another embodiment of the invention, the disposing step is conducted in such a way that a crystal axis of the second substrate and a crystal axis of the second semiconductor multilayer are aligned with each other.

In still another embodiment of the invention, the second semiconductor multilayer includes a plurality of second semiconductor layers, and wherein one of the plurality of second semiconductor layers that is in contact with the second substrate has the same composition as that of the second substrate.

In still another embodiment of the invention, the method further includes the step of providing grooves in at least one of a face of the second semiconductor multilayer and a face of the second substrate that is in contact with the second semiconductor layer, the grooves reaching at least one edge of at least one of the faces.

In still another embodiment of the invention, the method further includes the step of removing at least a portion of the first semiconductor substrate after bonding the second semiconductor multilayer and the second substrate.

In still another embodiment of the invention, the method further includes the steps of: forming an etching stopper layer between the first semiconductor substrate and the first semiconductor multilayer, the etching stopper layer having the first conductivity type and having a composition different from a composition of the first semiconductor multilayer; and removing the first semiconductor substrate until at least the etching stopper layer is exposed after the bonding step.

In still another embodiment of the invention, the method further includes the steps of: forming an electrode on a portion of a face of the first semiconductor substrate exposed after removing at least a portion of the first semiconductor substrate; and forming a reflective film on at least a portion of the exposed face of the first semiconductor substrate except where the electrode is formed.

In still another embodiment of the invention, the method further includes the steps of: forming an electrode on a portion of a face of the first semiconductor substrate exposed after removing at least a portion of the first semiconductor substrate; removing at least a portion of the first semiconductor substrate, the first semiconductor multilayer, and the light emitting layer to expose a portion of a face of the second semiconductor multilayer; and forming an electrode on a portion of an exposed face of the second semiconductor multilayer.

In still another embodiment of the invention, the method further includes the step of forming a dopant layer having the second conductivity type on at least one of a face of the second semiconductor multilayer and a face of the second substrate before the bonding step.

In still another embodiment of the invention, the heating is conducted by radiating light through the second substrate, the light having a wavelength absorbable by the second semiconductor multilayer.

In still another embodiment of the invention, the heating is conducted by radiating light through the second substrate, the light having a wavelength absorbable by the dopant layer.

According to another aspect of the invention, a method for producing a light emitting device includes the steps of: forming a semiconductor multilayer on a first substrate, the semiconductor multilayer including at least a light emitting layer; disposing a second substrate which is transparent to light emitted from the light emitting layer on the semiconductor multilayer; bonding the second substrate and the semiconductor multilayer through direct bonding with heating a vicinity of a interface between the second substrate and the semiconductor multilayer; and removing at least part of the first substrate.

In a method for producing an LED according to the present invention, semiconductor layers including a light emitting layer are formed on a first substrate which is opaque to the light emitted from the light emitting layer but is almost lattice-matched with the semiconductor layers. Therefore, the light emitting layer emits light with a high internal efficiency. A second substrate is bonded above the first substrate on which a light emitting structure is layered, so as to improve a external emission efficiency. As a result, according to the present invention, an LED which inherently achieves a higher internal emission efficiency by forming semiconductor layers on a semiconductor substrate opaque to generated light can be allowed to a high external emission efficiency without deteriorating the internal emission efficiency. Therefore, the present invention greatly contributes to the improvement of luminance and productivity of LEDs.

Thus, the invention described herein makes possible an advantage of providing a relatively simple method for producing a chemically stable LED with sufficient physical strength and improved external emission efficiency, without sacrificing the internal emission efficiency of the LED.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying drawings. Like components will be indicated by like numerals throughout FIGS. 1 to 12, unless specified otherwise.

Example 1

Figure 1:
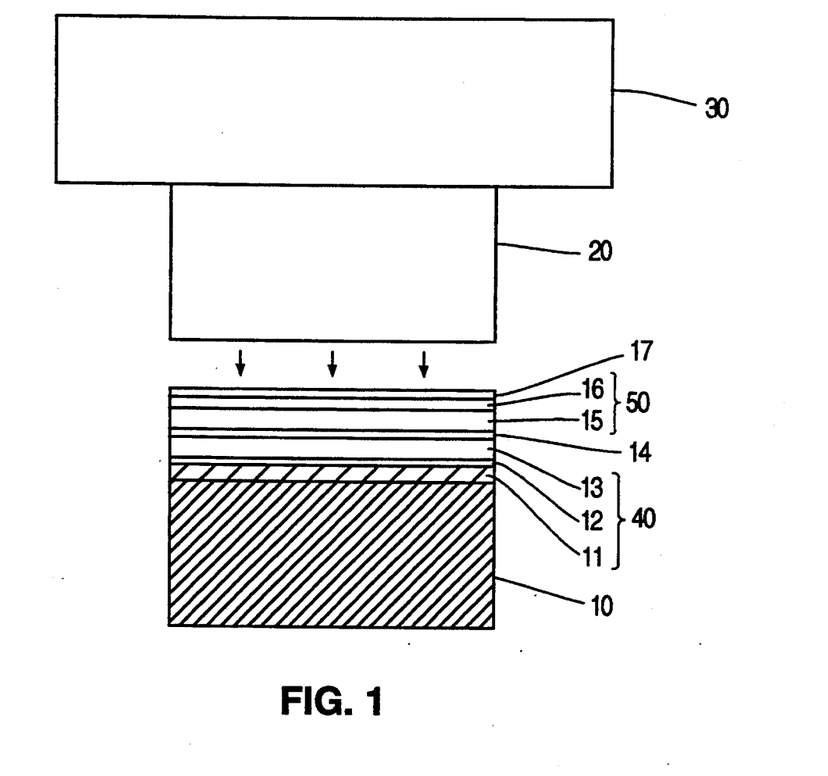
FIG. 1 is a cross-sectional view showing an LED in a step during a fabrication method according to a first example of the present invention.
Figure 2:
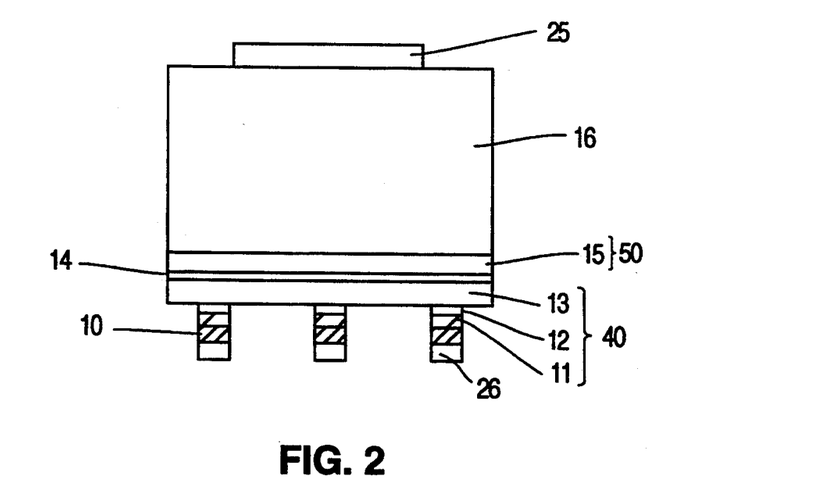
FIG. 2 is a cross-sectional view showing an LED obtained in a first example of the present invention.

FIG. 1 shows a cross section of an LED in a step during fabrication according to the present example. FIG. 2 shows a cross section of the LED produced by a method of the present invention.

As is shown in FIG. 2, an AlGaInP-type LED of the present example includes an n-type first semiconductor multilayer 40 and a p-type second semiconductor multilayer 50 opposing each other, with a light emitting layer 14 interposed therebetween. The first semiconductor multilayer 40, which is composed of a buffer layer 11, an intermediate band gap layer 12, and a first cladding layer 13, is formed on a first substrate 10 made of an n-type semiconductor material opaque to the generated light. The second semiconductor multilayer 50 is composed of a second cladding layer 15 and a capping layer (not shown). The capping layer and a second substrate (not shown) formed thereupon, which are made of a p-type semiconductor material transparent to the generated light, integrally define a retaining layer 60. Back-side electrodes 26 are formed on the lower face of the first substrate 10. A front-side electrode 25 is formed on the upper face of the retaining layer 60.

The LED having the above-mentioned configuration is fabricated in the following manner, according to the present example:

First, as is shown in FIG. 1, the buffer layer 11, the intermediate band gap layer 12, the first cladding layer 13, the undoped light emitting layer 14, the second cladding layer 15, and the capping layer 16 are epitaxially grown, in this order, on a surface of the first substrate 10 made of the n-type semiconductor material opaque to the light emitted from the light emitting layer 14, by an MOCVD method. The surface of the first substrate 10 is the (100) plane. Next, a dopant layer 17 is formed on the capping layer 16 by a vacuum evaporation method. The dopant layer 17 is made of Zn and has a thickness of 5 nm.

Then, a surface of the second substrate 20 having the (100) plane is subjected to a slight etching treatment, etc. The second substrate 20 is made of the same material as that of the capping layer 16 and can transmit the light emitted from the light emitting layer 14. The second substrate 20 is disposed on the capping layer 16 in such a way that the etched surface of the second substrate 20 is in contact with the capping layer 20 and that the crystal axes of the second substrate 20 is aligned with the crystal axes of the capping layer 16. Next, a weight 30 (10 g/cm$^2$) made of carbon whose surface is treated so as to be rough is disposed on the second substrate 20. Herein, the term 'crystal axis' means the orientation flat direction, or the direction of the cleavage plane.

Thereafter, the above-mentioned LED structure is heated to 650° C. under a hydrogen (H$_2$) atmosphere, and is irradiated with a YAG (Yttrium Aluminum Garnet) laser beam through the second substrate 20, and is left for 2 hours. Thus, the second semiconductor multilayer 50 and the second substrate 20 are bonded through directly bonding. After the bonding of the second semiconductor multilayer 50 and the second substrate 20, the dopant layer 17 disappears due to diffusion of the zinc to the second substrate 20 and to the capping layer 16. As a result, the capping layer 16 and the second substrate 20 are integrated to constitute the retaining layer 60, as is shown in FIG. 2.

In the present example, the sizes, thicknesses, and compositions of the substrates 10 and 20 and the other semiconductor layers may be those shown below, for example:

The first substrate 10: (composition) n-GaAs; (thickness) 300 μm; (size) 10×12 mm$^2$.

The buffer layer 11: (composition) n-GaAs; (thickness) 2 μm.

The intermediate band gap layer 12: (composition) n-Ga$_{0.5}$In$_{0.5}$P; (thickness) 0.1 μm.

The first cladding layer 13: (composition) n-Al$_{0.5}$In0.5P; (thickness) 1 μm.

The light emitting layer 14: (composition) (Al$_{0.2}$Ga$_{0.8}$)$_{0.5}$In$_{0.5}$P; (thickness) 0.5 μm.

The second cladding layer 15: (composition) p-Al$_{0.5}$In$_{0.5}$P; (thickness) 1 μm.

The capping layer 16: (composition) p-GaP; (thickness) 2 μm.

The second substrate 20: (composition) p-GaP; (thickness) 300 μm; (size) 10×12 mm$^2$.

Figure 3A:
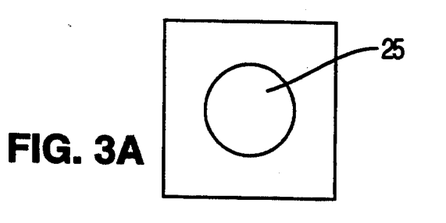
FIG. 3A is a cross-sectional view showing an electrode pattern for the LED according to a first example of the present invention.
Figure 3B:
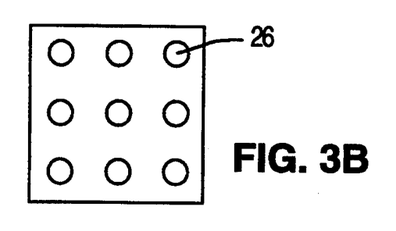
FIG. 3B is a cross-sectional view showing an electrode pattern for the LED according to a first example of the present invention.

Next, the first substrate 10 is etched so as to be left with a thickness of 10 μm. Then, the front-side electrode 25 made of AuZn is deposited on the upper face of the second substrate 20 by evaporation, and is patterned into a circular shape by a photolithography technique, as is shown in FIG. 3A. The back-side electrode 26 made of AuGe is deposited on the lower face of the first substrate 10. Thereafter, a resist pattern having a dot pattern is formed on the back-side electrode 26 by a photolithography technique, as is shown in FIG. 3B. Portions of the back-side electrode 26, the first substrate 10, the buffer layer 11, and the intermediate band gap layer 12 which are not covered by the resist pattern are removed. Thereafter, the resist pattern is also removed.

The above-described LED structure is divided into chips by dicing. Each chip is attached to a stem by means of an electrically conductive paste in such a way that the back-side electrodes 26 are electrically connected to the stem. Next, wires are bonded on the front-side electrode 25. Then, each chip is sealed with resin.

The interface between the capping layer 16 and the second substrate 20 which constitute the retaining layer 60 was observed from above the retaining layer 60 by means of an optical microscope. It was confirmed that junction defects were present only in the vicinity of a small amount of dusts remaining in the interface, and that the junction between the capping layer 16 and the second substrate 20 had uniformly been achieved for the most part. The strength of the bonding was such that no peeling occurred after the dicing step, during which a very large force is applied to the LED structure.

The lattice constants of the GaAs used for the first substrate 10 and the GaP used for the second substrate 20 are, respectively, 5.653 angstroms and 5.451 angstroms, making a difference of 3.7% (based on the lattice constant of the GAP). In view of the possible occurrence of lattice defects owing to the 3.7%'s difference in lattice constants, a cross section of the interface between the capping layer 16 and the second substrate 20 was observed by means of an ultra-high-resolution microscope. While some lattice defects were found in the capping layer 16 and the interface, none was observed in the other portions. As a comparative example, an LED was fabricated in which a p-GaP layer was grown to a large thickness in the place of a retaining layer by the use of an MOCVD method, whose cross section was observed. A number of lattice defects were found in the overall p-GaP layer, indicative of the relative advantage of the fabrication method of the present invention.

There arises a notch at the interface of the second substrate 20 and the capping layer 16 due to band discontinuity. The dopant layer 17 is provided in the interspace between the capping layer 16 and the second substrate 20 so as to reduce electric resistance caused by the notch at the interface. Zn, or another group II element of the periodic table is used for the dopant layer 17 in the present example, while S, Se, and Te, which are the group VI elements of the periodic table, may alternatively be used in the case where the second substrate 20 and the capping layer 16 have n-type conductivities.

Although the thickness of the dopant layer 17 is 5 nm in the present example, it may be any value which is preferably the same as or less than 100 nm so that the dopant layer 17 can disappear due to diffusion after the capping layer 16 and the second substrate 20 are bonded through direct bonding. Furthermore, the dopant layer 17 need not be provided at all.

The method of the present example has an advantage in that semiconductor properties of the obtained LED do not deteriorate due to the overheating of the internal semiconductor structure thereof, because light having a wavelength absorbable by the dopant layer 17 is used for the irradiation so as to only locally heat the bonding interface between the dopant layer 17 and the second substrate 20. Although a YAG laser is used as a light source in the present example, a halogen lamp, an Ar laser, and a $CO_2$ may alternatively be used as long as light of a wavelength transmittable through the second substrate 20 is generated. Although the light-induced heating is conducted through the second substrate 20 in the present example, it may alternatively be conducted through the first substrate 10. It is also applicable to conduct a conventional heating instead of the light-induced heating.

The bonding between layers improves as the temperature at which the bonding is conducted increases; however, the temperature should not be too high so as not to destroy the semiconductor layer structure of the LED. Accordingly, the temperature range should preferably be in the range of room temperature to 900° C. in the case of light-induced heating, and in the range of 300° C. to 900° C. in the case of conventional heating. Although a hydrogen ($H_2$) atmosphere is used in the present example, an atmosphere of vacuum, $PH_3$, $ASH_3$, alkyl phosphines, or alkyl arsines may suitably be used. Also applicable are atmospheres of $N_2$, dry air, Ar, etc. The weight 30 is dispensable in the bonding process. However, it is preferable to use a weight as long as the substrates are not destroyed thereby, e.g. a weight in the range 0 to 10 kg/cm$^2$, in view of possible dislocation of layers due to physical vibration and warping of the substrates.

Although the second substrate 20 is made of GaP in the present example, it may alternatively be made of ZnSe, ZnS, SiC, etc. as long as it is capable of transmitting the generated light. The surface treatment can also be conducted for the capping layer 16 as well as for the second substrate 20, or, in the alternative, not conducted at all. Although the surface treatment is conducted by etching in the present example, it may alternatively by a washing process with purified water, for example.

Although the surface of the first substrate 10 is prescribed to be the (100) plane in the present example, the present invention intends to provide no restrictions therefor. For example, it is also applicable to use a surface orientation tilting from the (100) plane by 1° to 15°. The (111) A plane and the (111) B plane can similarly be used. The conductivity of the first substrate 10 may alternatively be a p-type, in which case the respective conductivities of the layers 11 to 16 and the second substrate 20 are to be reversed. As for the removal of the first substrate 10, it may be conducted by lapping instead of etching, or may not be conducted at all in the alternative.

The surface orientations of the first and second substrates 10 and 20 do not need to be identical. For example, it has been confirmed that a sufficient bonding was realized in the case where the surface orientation of the first substrate 10 may be tilted by 10° from the (100) plane, the surface orientation of the second substrate 20 being the (100) plane. The crystal orientations of the first and second substrates 10 and 20 do not need to be aligned with each other, either. For example, it has been confirmed that a sufficient bonding was realized in the case where the [011] orientation of the first substrate 10 is dislocated by 1° to 2° from the [011] orientation of the second substrate 20. It is possible to achieve bonding even in cases where the crystal orientations of the first substrate 10 is dislocated more drastically, e.g. 45°, from that of the second substrate 20.

The capping layer 16 allows the bonding of the second semiconductor multilayer 50 and the second substrate 20 to be done easily and rapidly, and at a low temperature. Although it is possible to achieve the bonding without forming the capping layer 16, in which case the cladding layer 15 comes on top of all the layers in the second semiconductor multilayer 50, it is preferable to provide the capping layer 16, which makes for a better bonding.

The buffer layer 11 is provided in the interspace between the first substrate 10 and the intermediate band gap layer 12 so as to achieve a good crystal growth in the present example. However, the buffer layer 11 is dispensable. The intermediate band gap layer 12 is provided so as to minimize electrical resistance which would occur in an interface between the buffer layer 11 and the first cladding layer 13 in the case where they are in direct contact with each other and makes a notch due to band discontinuity. However, the buffer layer 11 may alternatively be a layer made of AlGaAs, or not be provided at all.

Although the front-side electrode 25 and the back-side electrodes 26 are made of AuZn and AuGe, respectively, it is also applicable to incorporate a p-side ohmic electrode and an n-side ohmic electrode of other kinds. Moreover, the front-side electrode 25 and the back-side electrodes 26 may constitute any pattern.

Although the semiconductor layers 11 to 16 are formed by an MOCVD method in the present example, they may alternatively be formed by methods such as an MBE (Molecular Beam Epitaxy), a gas source MBE, an MOMBE (Metal Organic Molecular Beam Epitaxy), and a CBE (Chemical Beam Epitaxy). The junction at the interface of the light emitting portion of the LED is not limited to a double heterojunction but may alternatively be a single heterojunction or a homojunction.

Example 2

Figure 4:
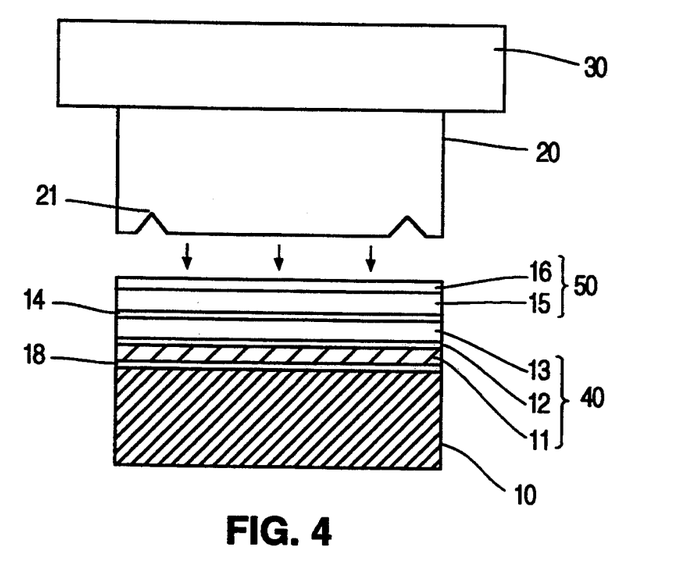
FIG. 4 is a cross-sectional view showing an LED in a step during a fabrication method according to a second example of the present invention.

FIG. 4 shows a cross section of an LED in a step during fabrication according to the present example.

Figure 5:
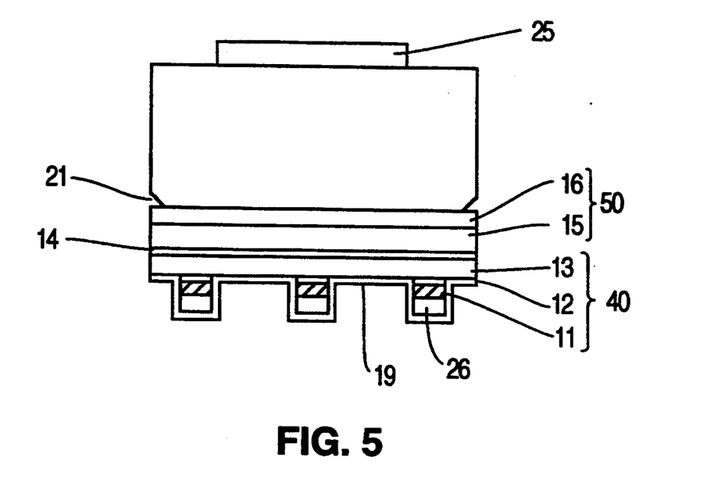
FIG. 5 is a cross-sectional view showing an LED obtained in a second example of the present invention.

FIG. 5 shows a cross section of the LED produced by a method of the present invention.

As is shown in FIG. 5, the AlGaInP-type LED of the present example includes an n-type first semiconductor multilayer 40 and a p-type second semiconductor multilayer 50 opposing each other, with a light emitting layer 14 interposed therebetween. The first semiconductor multilayer 40, which is composed of a buffer layer 11, an intermediate band gap layer 12, and a first cladding layer 13, is formed on a first substrate 10 made of an n-type semiconductor material opaque to any generated light. The second semiconductor multilayer 50 is composed of a second cladding layer 15 and a capping layer 16. On the upper face of the second semiconductor layer 50, there is formed a second substrate 20 which is made of a p-type semiconductor material transparent to the generated light. Grooves 21 are provided in one face of the second substrate 20 that is in contact with the second semiconductor multilayer 50. Back-side electrodes 26 are formed on the lower face of the buffer layer 11. A reflective film 19 is formed so as to cover the entire area of the back (lower) face of the LED. A front-side electrode 25 is formed on the upper face of the second substrate 20.

The LED having the above-mentioned configuration is fabricated in the following manner, according to the present example:

First, as is shown in FIG. 4, an n-type etching stopper layer 18, the buffer layer 11, the intermediate band gap layer 12, the first cladding layer 13, the undoped light emitting layer 14, the second cladding layer 15, and the capping layer 16 are epitaxially grown, in this order, on a surface of the first substrate 10 made of the n-type semiconductor material opaque to the light emitted from the light emitting layer 14, by an MOCVD method. The surface of the first substrate 10 is the (100) plane.

Figure 6:
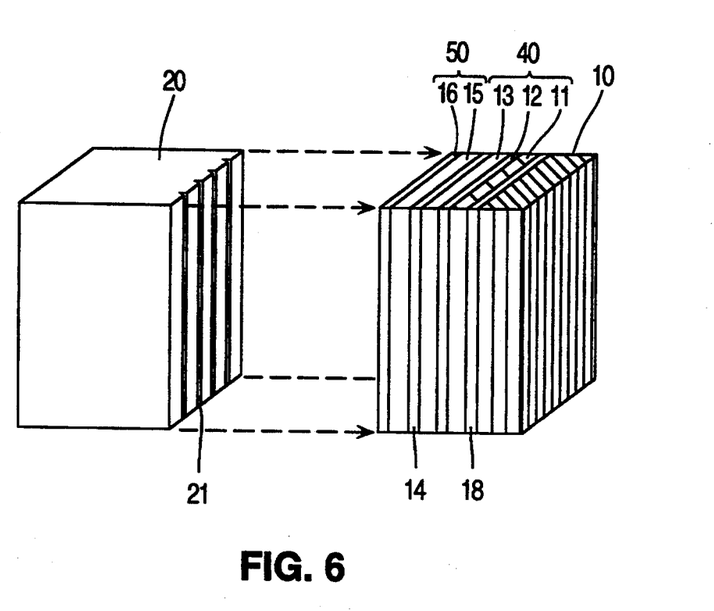
FIG. 6 is a schematic view showing a bonding process of a second semiconductor layer and a second substrate of an LED according to a second example of the present invention.

Then, as is shown in FIG. 6, the grooves 21 are provided in a face of the second substrate 20 by wet etching. The surface of the second substrate 20 is the (100) plane and will be in contact with the second semiconductor multilayer 50. The grooves 21 each reach the edges of the second substrate 20, and are formed at intervals of 300 μm from one another. Moreover, the grooves 21 are made so as to be aligned with dicing lines in the step of dividing the LED structure into chips (as will be described below). Then, the surface of the second substrate 20 is subjected to a slight etching treatment, etc. Subsequently, as is shown in FIGS. 4 and 6, the second substrate 20 is disposed on the second semiconductor multilayer 50 in such a way that the crystal axes of the second substrate 20 and the second semiconductor multilayer 50 are aligned with each other. Next, a weight 30 (100 g/cm$^2$) is disposed on the second substrate 20.

Thereafter, the above-mentioned LED structure is heated to 500° C. in an mixed atmosphere of PH$_3$ and H$_2$, and is left for 4 hours. Thus, the second semiconductor multilayer 50 and the second substrate 20 are bonded through direct bonding.

In the present example, thicknesses and compositions of the substrates 10 and 20 and the other semiconductor layers may be those shown below, for example:

The first substrate 10: (composition) n-GaAs; (thickness) 300 μm;.

The etching stopper layer 18: (composition) Al$_{0.5}$Ga$_{0.5}$As; (thickness) 2 μm;.

The buffer layer 11: (composition) n-GaAs; (thickness) 2 μm.

The intermediate band gap layer 12: (composition) n-Ga$_{0.5}$In$_{0.5}$P; (thickness) 20 μm.

The first cladding layer 13: (composition) n-(Al$_{0.7}$In$_{0.3}$P)$_{0.5}$In$_{0.5}$; (thickness) 1 μm.

The light emitting layer 14: (composition) (Al$_{0.4}$Ga$_{0.6}$)$_{0.5}$In$_{0.5}$P; (thickness) 1 μm.

The second cladding layer 15: (composition) p-(Al$_{0.7}$In$_{0.3}$P)$_{0.5}$In$_{0.5}$P; (thickness) 1 μm.

The capping layer 16: (composition) p-GaP; (thickness) 2 μm.

The second substrate 20: (composition) p-GaP; (thickness) 300 μm.

Next, the first substrate 10 is etched away by using a selective etchant (a mixed solution of ammonia and hydrogen peroxide and water) incapable of etching the etching stopper layer 18 which is disposed on the first substrate 10. Then, the etching stopper layer 18 is etched away by using a selective etchant (hydrofluoric acid) incapable of etching the buffer layer 11 which is disposed on the etching stopper layer 18. Then, the front-side electrode 25 is deposited on the upper face of the second substrate 20 by evaporation, and is patterned into a circular shape by a photolithography technique, as is shown in FIG. 3A. The back-side electrode 26 is deposited on the entire lower face of the buffer layer 11 by evaporation. Thereafter, a resist pattern having a dot pattern is formed on the back-side electrode 26 by a photolithography technique, as is shown in FIG. 3B. Portions of the back-side electrode 26, the buffer layer 11, and the intermediate band gap layer 12 which are not covered by the resist pattern are removed. Thereafter, the resist pattern formed on the back-side electrodes 26 is also removed. Furthermore, the reflective film 19, made of Al or the like, is formed on the entire lower face of the first semiconductor multilayer 40 as is described above, by the use of a sputtering method.

The above-described LED structure is divided into chips by dicing. Each chip is attached to a stem by means of an electrically conductive paste in such a way that the back-side electrodes 26 are connected to the stem. Next, wires are bonded on the front-side electrode 25. Then, each chip is sealed with resin.

In the present example, the grooves 21 reaching the edges of the second substrate 20 are provided in the bonding interface of the second substrate 20 so that voids (bubbles) and impurities will easily be eliminated. Gas remaining in the bonding interface, which contains such impurities, are lead through the grooves 21 to the outside so as to be thus eliminated. Although the grooves 21 are formed in a stripe shape and in a single direction in the present example, it is also applicable to form the grooves 21 in a meshed shape consisting of ranks and files. The grooves 21 do not need to be formed so as to correspond to the dicing lines as in the present example. The grooves 21 may alternatively be formed in the second semiconductor multilayer 50 or the first substrate 10. In that case, the grooves 21 are to be formed after the second cladding layer 15 is formed or before the etching stopper layer 18 is formed.

In the present example, the etching stopper layer 18 having a composition different from the first substrate 10 is formed on the first substrate 10. As a result, the first substrate 10 is selectively etched with high accuracy and with facility, independent of the etching time. The etching stopper layer 18 does not need to be removed, in which case the buffer layer 11 is not necessary. There is no limitation to the material for the etching stopper layer 18 according to the present example, as long as the material has a composition different from both of the compositions of the first and second substrates 10 and 20 (i.e. GaAs). For example, $Ga_{0.5}In_{0.5}P$ may suitably be used for the etching stopper layer 18.

According to the present example, light which reaches the lower face of the n-side (first) semiconductor multilayer 40 is reflected so as to be utilized, because the first substrate 10 opaque to the generated light is removed. Thus, the external emission efficiency can be improved. This effect is further enhanced by forming the reflective film 19 after the formation of the back-side electrodes 26, as in the present example. Although a similar effect can be obtained at the lower face of an LED where the LED is attached to a stem usually by means of an Ag paste, incorporation of the reflective film 19 has an advantage of further increasing the reflectance of the light at the lower face of the LED. When the reflective film 19 is a metal film made of Al or the like, as in the present example, an applied current flows by way of the back-side electrodes 26, since no ohmic contact is provided between the reflective film 19 and the back-side electrodes 26 and the first cladding layer 13 as one of the semiconductor layers. The reflective film 19 may alternatively be made of, instead of a metal film, a dielectric multilayer film such as a multilayer film of alternating $TiO_2$ layers and $SiO_2$ layers. In that case, it is necessary to remove a part of the reflective film 19 on the back-side electrodes 26.

The present example also permits the modifications applicable to Example 1.

Example 3

Figure 7:
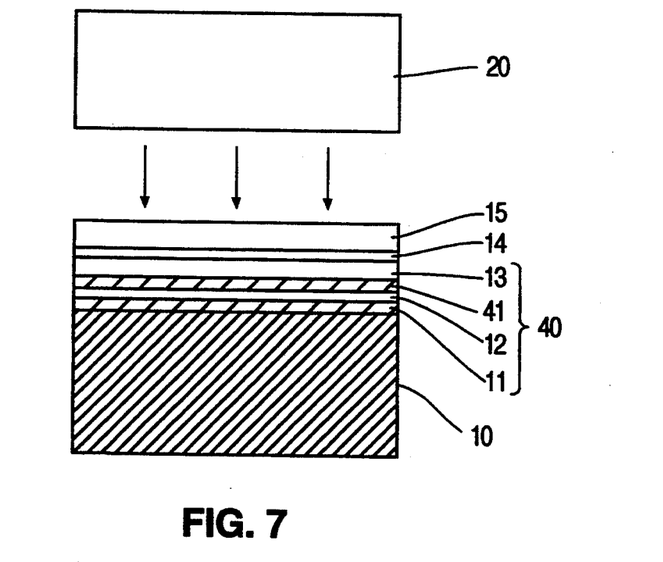
FIG. 7 is a cross-sectional view showing an LED in a step during a fabrication method according to a third example of the present invention.
Figures 8, 9:
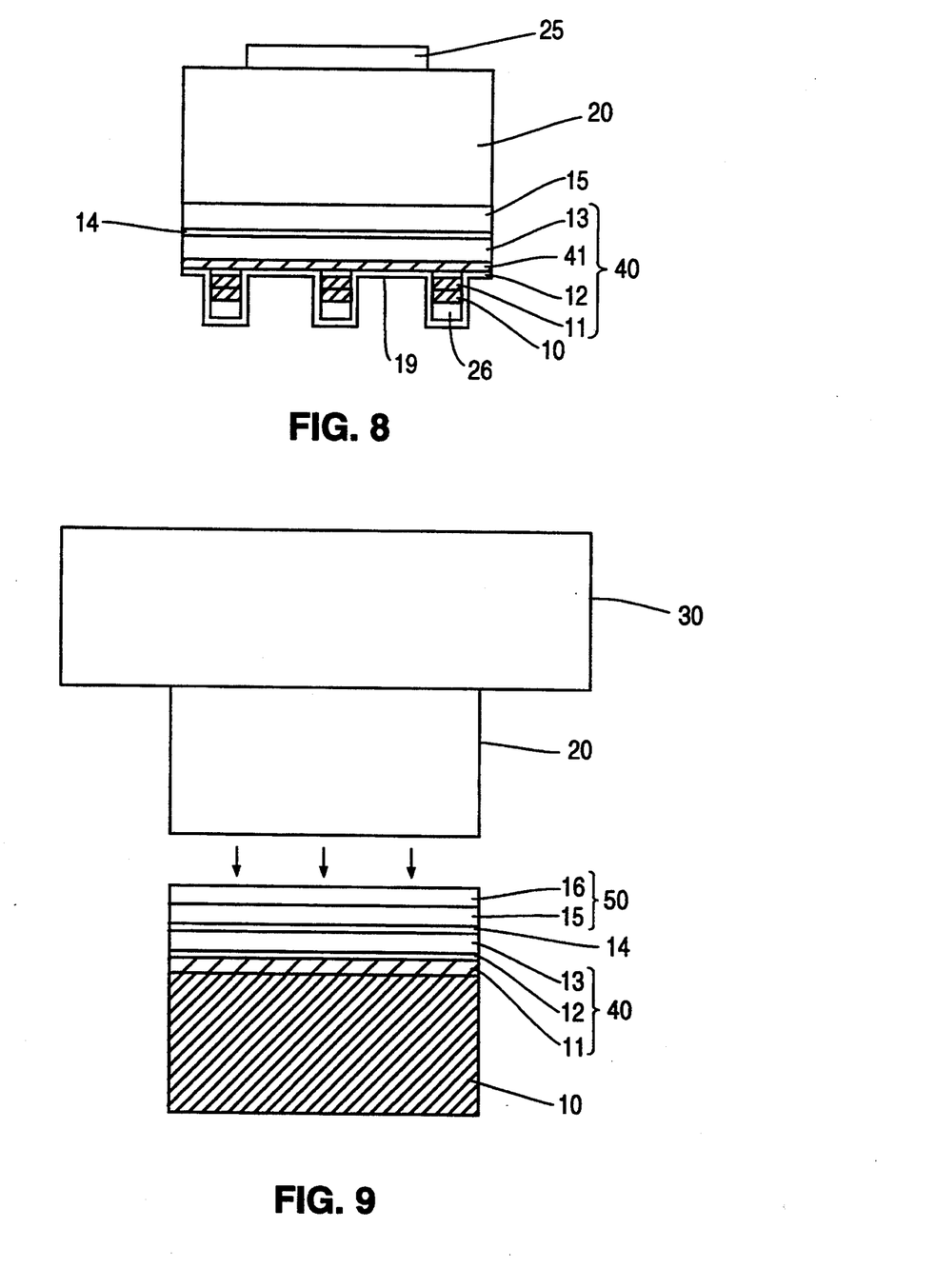
FIG. 8 is a cross-sectional view showing an LED obtained in a third example of the present invention.
FIG. 9 is a cross-sectional view showing an LED in a step during a fabrication method according to a fourth example of the present invention.

FIG. 7 shows a cross section of an LED in a step during fabrication according to the present example. FIG. 8 shows a cross section of the LED produced by a method of the present example.

As is shown in FIG. 8, the ZnCdSe-type LED of the present example includes an n-type first semiconductor multilayer 40 and a second cladding layer 15 serving as a p-type second semiconductor multilayer that oppose each other, with a light emitting layer 14 interposed therebetween. The n-type first semiconductor multilayer 40, which is composed of a first buffer layer 11, an intermediate band gap layer 12, a second buffer layer 41 and a first cladding layer 13, is formed on a first substrate 10 made of an n-type semiconductor material opaque to any generated light. The light emitting layer 14 has a strained quantum well structure. On the upper face of the second cladding layer 15, there is formed a second substrate 20 which is made of a p-type semiconductor material transparent to the generated light. Back-side electrodes 26 are formed on the lower face of first substrate 10. A reflective film 19 is formed so as to cover the entire area of the back (lower) face of the LED. A front-side electrode 25 is formed on the upper face of the second substrate 20.

The LED having the above-mentioned configuration is fabricated in the following manner, according to the present example:

First, as is shown in FIG. 7, the first buffer layer 11, the intermediate band gap layer 12, the second buffer layer 41, the first cladding layer 13, the undoped strained quantum well structure light emitting layer 14, and the second cladding layer 15 are grown, in this order, on a surface the first substrate 10 made of the n-type semiconductor material opaque to the light emitted from the light emitting layer 14, by an MBE method. The surface of the first substrate 10 is the (100) plane.

Then, a surface of the second substrate 20 made of the p-type semiconductor material transparent to the generated light is subjected to a slight etching treatment, etc. The surface of the second substrate 20 is the (100) plane. Subsequently, the second substrate 20 is disposed on the second cladding layer 15 formed on the first substrate 10, in such a way that the crystal axes of the second substrate 20 and the second cladding layer 15 are aligned with each other.

Thereafter, the above-mentioned LED structure is heated to 500° C. in an mixed atmosphere of $H_2Se$ and $H_2$, and is left for 4 hours. Thus, the second cladding layer 15 and the second substrate 20 are bonded through direct bonding.

The first substrate 10: (composition) n-GaAs; (thickness) 300 μm; (size) 10×12 mm².

The first buffer layer 11: (composition) n-GaAs; (thickness) 5 μm.

The intermediate band gap layer 12: (composition) n-$Al_xGa_{1-x}As$; (thickness) 0.2 μm.

The second buffer layer 41: (composition) n-ZnSSe; (thickness) 1 μm.

The first cladding layer 13: (composition) n-ZnSe; (thickness) 1 μm.

The light emitting layer 14: (composition) $Zn_{0.8}Cd_{0.2}Se$; (thickness) 15 nm.

The second cladding layer 15: (composition) p-ZnSe; (thickness) 2 μm.

The second substrate 20: ( composition ) p-ZnSe; (thickness) 300 μm; (size) 10×12 mm².

Next, the first substrate 10 is etched so as to be left with a thickness of 10 μm. Then, the front-side electrode 25 is deposited on the upper face of the second substrate 20 by evaporation, and is patterned into a circular shape by a photolithography technique, as is shown in FIG. 3A. The back-side electrode 26 made of AuGe or the like is deposited on the lower face of the first substrate 10 by evaporation. Thereafter, a resist having a dot pattern is formed on the back-side electrode 26 by a photolithography technique, as is shown in FIG. 3B. Portions of the back-side electrode 26, the first substrate 10, the first buffer layer 11, and the intermediate band gap layer 12 which are not covered by the resist pattern are removed. Thereafter, the resist pattern formed on the back-side electrodes 26 is also removed. Furthermore, the reflective film 19, made of Al or the like, is formed on the entire lower face of the first semiconductor multilayer 40 as is described above, by the use of a sputtering method.

The above-described LED structure is divided into chips by dicing. Each chip is attached to a stem by means of an. electrically conductive paste in such a way that the back-side electrodes 26 are connected to the stem. Next, wires are bonded on the front-side electrode 25. Then, each chip is sealed with resin.

The interface between the second cladding layer 15 and the second substrate 20 which constitute the retaining layer 60 was observed from above the second substrate 20 by means of an optical microscope. It was confirmed that junction defects were present only in the vicinity of a small amount of dusts remaining in the interface, and that the bonding between the second cladding layer 15 and the second substrate 20 had uniformly been achieved for the most part. The strength of the bonding was such that no peeling occurred after the dicing step, during which a very large force is applied to the LED structure. A cross section of the interface between the second cladding layer 15 and the second substrate 20 was observed by means of an ultrahigh-resolution microscope. As a result, a number of lattice defects found in the interface between the second cladding layer 15 and the second substrate 20. However, no lattice defects was observed in the other portions. As a comparative example, a cross section of the second substrate 20 was observed before the bonding of the second cladding layer 15 and the second substrate 20. It was confirmed that lattice defects were present at the same density as after the bonding of the second cladding layer 15 and the second substrate 20, indicating that the lattice defects had occurred before the bonding.

In the present example, ZnSe is used for the second substrate 20. ZnSe has a lattice constant very similar to that of GaAs, which constitutes the first substrate 10, and is capable of transmitting the generated light. Moreover, the second cladding layer 15 is also made of ZnSe. Therefore, it is considered that ZnSe is one of the most suitable materials for the second substrate 20. Although the ZnSe used in the present example is of a single crystal structure, that of a polycrystal structure may alternatively be used. This would contribute to the reduction of the fabrication costs. Materials capable of transmitting light in a blue-green wavelength band, e.g. ZnS and SiC, may alternatively be used in the place of ZnSe, GaP, which is less capable of transmitting light in this wavelength band, is also applicable because the bandgap thereof is of an indirect transition type and the light absorption coefficient thereof is small.

A dopant layer (not shown) may be formed with a small thickness on the second cladding layer 15. Li, or another group I element of the periodic table may suitably be used for such a dopant layer, while a group V element of the periodic table, such as P, As, and Sb, are also applicable. In that case, it is possible to reduce the bonding temperature by utilizing light-induced heating along with a conventional heating treatment. In cases where the second substrate 20 is made of p-ZnSe, which means ZnSe and ZnSe face each other at the bonding interface, it is preferable to form the dopant layer made of a group III element of the periodic table, such as Al, Ga, and In.

Although the second substrate 20 and the second cladding layer 15 are bonded at a temperature at 500° C., the bonding can suitably be conducted in a broader range of 200° C. to 700° C.

Although a composite ratio x of the $Zn_{1-x}Cd_xS$ light emitting layer 14 is 0.2 in the present example, there is no limitation to the value of x. For example, x may be zero, in which case the light emitting layer 14 is made of ZnSe. The light emitting layer 14 may alternatively have a quantum well structure consisting of ZnSe/ZnCdSe, instead of a strained quantum well structure.

Although the second buffer layer 22 is made of n-ZnSSe in the present example, it may alternatively be made of n-InGaAs. Furthermore, the second buffer layer 22 may be a strained super lattice layer of n-ZnS/ZnSe.

The first cladding layer 13 and the second cladding layer 15 are both made of ZnSe in the present example. However, it is also applicable to use MgZnSSe for at least one of the first and second cladding layers 13 and 15; this means an increased bandgap, which makes it possible to confine electrons and holes within the light emitting layer 14 at an increased efficiency.

Although the semiconductor layers 11, 12, 41, 13, 14, and 15 are formed by an MBE method, an MOCVD method, an MOMBE method, a gas source MBE method, a CBE method, etc. are also applicable. Each semiconductor layer may be formed, as long as the above-described conditions therefor are satisfied, of a II–VI semiconductor material consisting of one selected from such group II elements of the periodic table as Mg, Cd and Zn and one selected from such group VI elements of the periodic table as Te, Se and S.

Although the front-side electrode 25 is made of Au, other p-type ohmic electrodes may alternatively be used. Although the back-side electrodes 26 are made of AuGe, other n-type ohmic electrodes may alternatively be used.

The present example also permits the modifications applicable to Example 1 and Example 2.

Example 4

Figure 10:
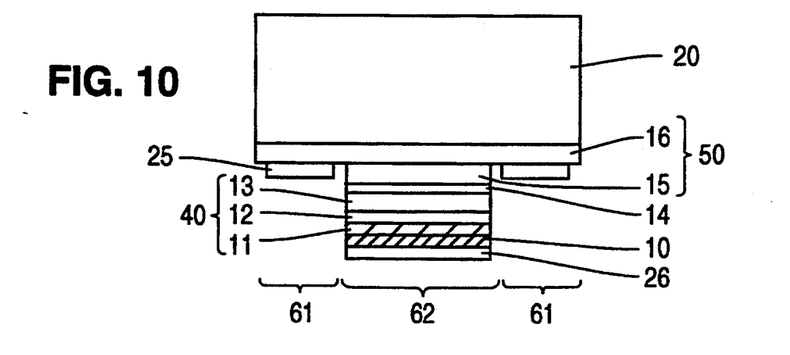
FIG. 10 is a cross-sectional view showing an LED obtained in a fourth example of the present invention.

FIG. 9 shows a cross section of an LED in a step during fabrication according to the present example. FIG. 10 shows a cross section of the LED produced by a method of the present example.

The LED of the present example is of an AlsGaInP-type, the same as the LED of Example 1, but is different from the LED of Example 1 in that a second substrate 20 is a dielectric substrate instead of a semiconductor substrate. Therefore, an electrode 25 is provided on a capping layer 16 by partially etching the first substrate side of the LED structure, instead of providing the electrode 25 on the second substrate 20. As is shown in FIG. 10, the LED of the present example includes an n-type first semiconductor multilayer 40 and a p-type second semiconductor multilayer 50 Opposing each other, with a light emitting layer 14 interposed therebetween. The first semiconductor multilayer 40, which is composed of a buffer layer 11, an intermediate band gap layer 12, and a first cladding layer 13, is formed on a first substrate 10 made of an n-type semiconductor material incapable of transmitting the generated light. The second semiconductor multilayer 50 is composed of a second cladding layer 15 and the capping layer 16. An electrode 26 is formed on the lower face of the first substrate 10.

The LED having the above-mentioned configuration is fabricated in the following manner, according to the present example:

First, as is shown in FIG. 9, the n-type buffer layer 11, the intermediate band gap layer 12, the n-type first cladding layer 13, the undoped light emitting layer 14, the p-type second cladding layer 15, and the p-type capping layer 16 are grown, in this order, on a surface of the first substrate 10 made of the n-type semiconductor material opaque to the generated light by an MOCVD method. The surface of the first substrate 10 is the (100) plane.

Then, the second substrate 20 made of a glass capable of transmitting the generated light is placed on the p-type capping layer 16. There is no restriction as to the direction in which the second substrate 20 should be disposed, since the second substrate 20 is made of glass, which has no structural orientations. Next, a weight 30 (10 g/cm$^2$) made of graphite is disposed on the second substrate 20. Thereafter, the above-mentioned LED structure is heated to 450° C. in an H$_2$ atmosphere, and is left for 2 hours. Thus, the p-type capping layer 16 and the second substrate 20 are bonded through direct bonding.

In the present example, the thicknesses and compositions of the substrates 10 and 20 and the other semiconductor layers may be those shown below, for example:

The first substrate 10: (composition) n-GaAs; (thickness) 200 μm.

The buffer layer 11: (composition) n-GaAs; (thickness) 1 μm.

The intermediate band gap layer 12: (composition) n-Ga$_{0.5}$In$_{0.5}$P; (thickness) 0.1 μ.

The first cladding layer 13: (composition) n-Al$_{0.5}$In$_{0.5}$P; (thickness) 1 μ.

The light emitting layer 14: (composition) (Al$_{0.2}$Ga$_{0.8}$)$_{0.5}$In$_{0.5}$P; (thickness) 0.5 μm.

The second cladding layer 15: (composition) p-Al$_{0.5}$In$_{0.5}$P; (thickness) 2 μm.

The capping layer 16: (composition) p-GaP; (thickness) 2 μm.

The second substrate 20: (composition) glass; (thickness) 200 μm.

Next, the first substrate 10 is etched so as to be left with a thickness of 10 μm. Moreover, the first substrate 10 and the semiconductor layers 11 to 15 are removed in a peripheral portion 61 of the LED structure so as to expose the p-type capping layer 16.

Then, the n-side electrode 26 is formed on a portion of the first substrate 10 remaining in the center portion 62 of the LED structure. The p-side electrode 25 is formed on the exposed portion of the p-type capping layer 16 located in the peripheral portion 61 of the LED structure.

The above-described LED structure is divided into chips by dicing. Each chips attached to a stem. Then, each chip is sealed with resin to form an LED.

In the LED according to the present example, the capping layer 16 and the second substrate 20 made of a dielectric material are bonded through direct bonding. The strength of the bonding proved to be such that no peeling occurred even after the dicing step, during which a very large force is applied to the LED structure.

The second substrate 20 may alternatively be a dielectric substrate made of Al$_2$O$_3$, TiO$_2$, MgO, and compounds thereof, in the place of glass.

Although the surface of the GaAs first substrate is the (100) plane in the present example, it may be any plane.

Example 5

Figure 11:
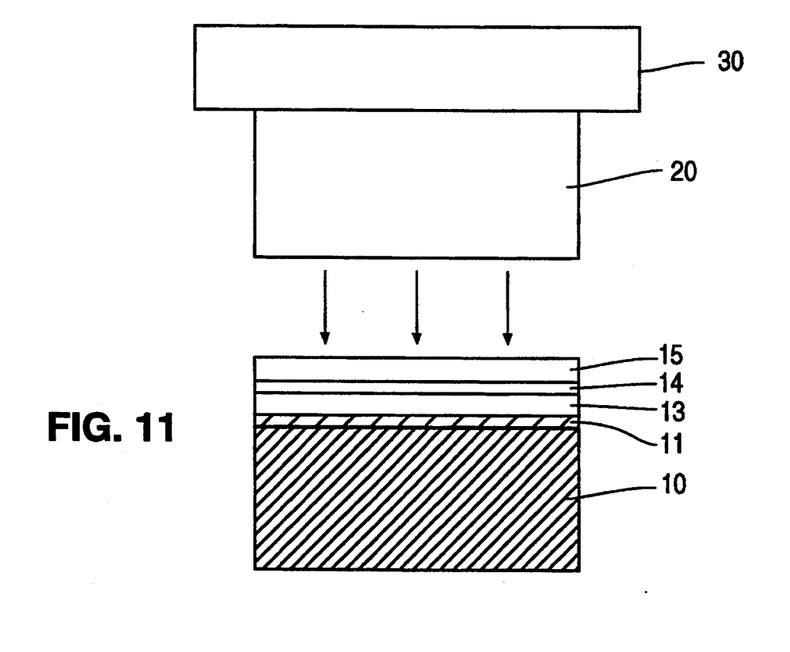
FIG. 11 is a cross-sectional view showing an LED in a step during a fabrication method according to a fifth example of the present invention.
Figure 12:
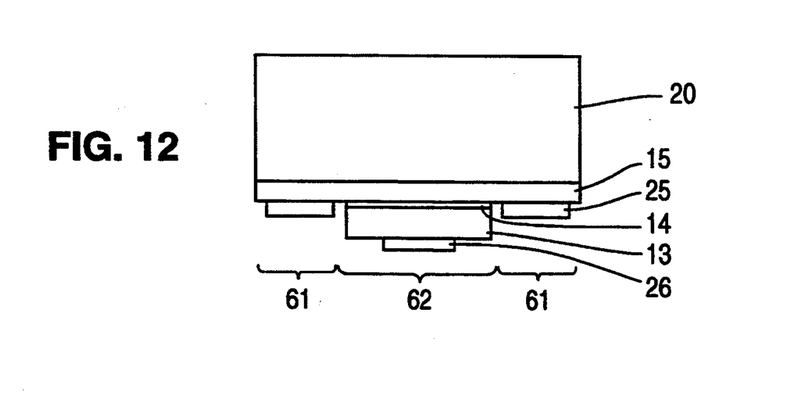
FIG. 12 is a cross-sectional view showing an LED obtained in a fifth example of the present invention.

FIG. 11 shows a cross section of an LED in a step during fabrication according to the present example. FIG. 12 shows a cross section of the LED produced by a method of the present example.

The LED of the present example is of a ZnCdSe-type, as well as the LED of Example 3, but is different from the LED of Example 3 in that a second substrate 20 is a dielectric substrate instead of a semiconductor substrate. Therefore, a front-side electrode 25 is provided on a second cladding layer 15 by partially etching the first substrate side of the LED structure, instead of providing the electrode 25 on the second substrate 20. As is shown in FIG. 11, the ZnCdSe-type LED of the present example includes an n-type first cladding layer 13 and a p-type second cladding layer 15 opposing each other, with a light emitting layer 14 interposed therebetween. A back-side electrode 26 is formed on the lower side of the first cladding layer 13.

The LED having the above-mentioned configuration is fabricated in the following manner, according to the present example:

First, as is shown in FIG. 11, an n-type buffer layer 11, the n-type first cladding layer 13, the undoped light emitting layer 14, and the p-type second cladding layer 15 are grown, in this order, on a surface of the first substrate 10 made of the n-type semiconductor material opaque to the generated light, by an MBE method. The surface of the first substrate 10 is the (100) plane.

Then, the second substrate 20 made of sapphire capable of transmitting the generated light is disposed on the second cladding layer 15 in such a way that a projection of the c axis of the crystal axes thereof on the surface of the second substrate 20 is perpendicular to the cleave plane of the first substrate 10. The surface of the second substrate 20 is the (1, 1, −2, 2) plane. A weight 30 (100 g/cm$^2$) made of Mo is placed on the second substrate 20.

Thereafter, the above-mentioned LED structure is heated to 500° C. in an H$_2$ atmosphere, irradiated with an Ar laser beam (wavelength: 488 nm), and left for 2 hours. The Ar laser beam is transmitted through the second substrate 20 of sapphire, and is absorbed by the p-type second cladding layer 15. Thus, the p-type second cladding layer 15 and the second substrate 20 are bonded through direct bonding.

In the present example, the thicknesses and compositions of the substrates 10 and 20 and the other semiconductor layers may be those shown below, for example:

The first substrate 10: (composition) n-GaAs; (thickness) 200 μm.

The buffer layer 11: (composition) n-GaAs; (thickness) 1 μm.

The first cladding layer 13: (composition) n-ZnSe; (thickness); 3 μm.

The light emitting layer 14: (composition) Zn$_{0.8}$Cd$_{0.2}$Se; (thickness) 15 nm.

The second cladding layer 15: (composition) p-ZnSe; (thickness) 2μm.

The second substrate 20: (composition) sapphire; (thickness) 200 μm.

Next, as is shown in FIG. 12, the first substrate 10 and the n-type buffer layer 11 are removed. Moreover, the first substrate 10 and the semiconductor layers 11 to 14 are removed in a peripheral portion 61 of the LED structure so as to expose the p-type second cladding layer 15.

Then, the back-side electrode 26 made of Au is formed on a portion of the n-type first cladding layer 13 remaining in the center portion 62 of the LED structure. The front-side electrode 25 made of Au is formed on the exposed portion of the p-type second cladding layer 15 located in the peripheral portion 61 of the LED structure.

The above-described LED structure is then divided into chips by dicing. Each chip is attached to a stem.

Then, each chip is sealed with resin so as to form an LED.

In the LED according to the present example, the second cladding layer 15 and the second substrate 20 made of a dielectric material are bonded through direct bonding. The strength of the bonding proved to be such that no peeling occurred after the dicing step, although a very large force is applied to the LED structure during this step.

Although an irradiation with an Ar laser beam is conducted in the bonding process so as to effectively heat the bonding interface alone in the present example, no laser irradiation is required in cases where the bonding can be conducted by a conventional heating process.

The second substrate 20 may alternatively be a dielectric substrate made of ploycrystal alumina, $TiO_2$, MgO, and compounds thereof, in the place of sapphire.

The surface of the first substrate 10 made of GaAs is the (100) plane, while the surface of the second substrate 20 made of sapphire is the (1, 1, −2, −2) in the present example. However, the surface of the substrate 10 may alternatively be the (111) B plane, the (111) A plane, or a plane tilted by 1° to 15° from the (111) B plane or the (111) A plane. In this case, the surface of the second substrate 20 may suitably be prescribed to be the (0001) plane, that is, the c plane. However, the surface orientations of the GaAs first substrate 10 and the second substrate 20 do not need to be of one of the combinations described above. For example, the surface of the GaAs substrate 10 may be the (100) plane or the surface of the sapphire second substrate 20 being the (0001) plane.

The present example also permits the modifications applicable to Example 3.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a light emitting diode, the method comprising the steps of:
   epitaxially growing a first semiconductor multilayer on a first semiconductor substrate having a first conductivity type, the first semiconductor multilayer including at least one first semiconductor layer having the first conductivity type;
   epitaxially growing a light emitting layer on the first semiconductor multilayer;
   epitaxially growing a second semiconductor multilayer on the light emitting layer, the second semiconductor multilayer including at least one second semiconductor layer having a second conductivity type;
   disposing a second substrate on the second semiconductor multilayer, the second substrate being transparent to light emitted from the light emitting layer; and
   bonding the second substrate and the second semiconductor multilayer through direct bonding with heating the vicinity of an interface between the second substrate and the second semiconductor multilayer.

2. A method according to claim 1, wherein the second substrate is made of a semiconductor material having the second conductivity type.

3. A method according to claim 2, wherein the second substrate is made of at least one selected from the group consisting of GaP, ZnSe, ZnS, and SiC.

4. A method according to claim 1, wherein the second substrate is made of a dielectric material.

5. A method according to claim 4, wherein the second substrate is made of at least one selected from the group consisting of $Al_2O_3$, glass, $TiO_2$, MgO, and a compound thereof.

6. A method according to claim 1, wherein the bonding step is conducted by applying a pressure from the side of at least one of the first seminconductor substrate and the second substrate.

7. A method according to claim 1, wherein the disposing step is conducted in such a way that a crystal axis of the second substrate and a crystal axis of the second semiconductor multilayer are aligned with each other.

8. A method according to claim 2, wherein the second semiconductor multilayer includes a plurality of second semiconductor layers, and wherein one of the plurality of second semiconductor layers that is in contact with the second substrate has the same composition as that of the second substrate.

9. A method according to claim 1 further comprising the step of providing grooves in at least one of a face of the second semiconductor multilayer and a face of the second substrate that is in contact with the second semiconductor layer, the grooves reaching at least one edge of at least one of the faces.

10. A method according to claim 1 further comprising the step of removing at least a portion of the first semiconductor substrate after bonding the second semiconductor multilayer and the second substrate.

11. A method according to claim 10 further comprising the step of
   forming an etching stopper layer between the first semiconductor substrate and the first semiconductor multilayer, the etching stopper layer having the first conductivity type and having a composition different from a composition of the first semiconductor multilayer, and wherein the step of removing at least the portion of the first semiconductor substrate is performed until the etching stopper layer is exposed.

12. A method according to claim 10 further comprising the steps of:
   forming an electrode on a portion of a face of the first semiconductor substrate exposed after removing at least the portion of the first semiconductor substrate; and
   forming a reflective film on the exposed face of the first semiconductor substrate except where the electrode is formed.

13. A method according to claim 10 further comprising the steps of:
   forming an electrode on a portion of a face of the first semiconductor substrate exposed after removing at least the portion of the first semiconductor substrate;
   removing at least a portion of the first semiconductor substrate, the first semiconductor multilayer, and the light emitting layer to expose a portion of a face of the second semiconductor multilayer; and
   forming an electrode on the portion of the exposed face of the second semiconductor multilayer.

14. A method according to claim 1 further comprising the step of forming a dopant layer having the second conductivity type on at least one of a face of the second semiconductor multilayer and a face of the second substrate before the bonding step.

15. A method according to claim 1, wherein the heating is conducted by radiating light through the second substrate, the light having a wavelength absorbable by the second semiconductor multilayer.

16. A method according to claim 14, wherein the heating is conducted by radiating light through the second substrate, the light having a wavelength absorbable by the dopant layer.

17. A method for producing a light emitting device, the method of comprising the steps of:
    epitaxially growing a semiconductor multilayer on a first substrate, the semiconductor multilayer including a light emitting layer, first semiconductor layer of a first conductivity type, and a second semiconductor layer of a second conductivity type, the light emitting layer being interposed between the first semiconductor layer and the second semiconductor layer;
    disposing a second substrate which is transparent to light emitted from the light emitting layer on the semiconductor multilayer;
    bonding the second substrate and the semiconductor multilayer through direct bonding with heating a vicinity of an interface between the second substrate and the semiconductor multilayer; and
    removing at least part of the first substrate; and
    forming a pair of electrodes electrically connected to the first semiconductor layer and the second semiconductor layer, respectively.

* * * * *